(12) United States Patent
Tsujita et al.

(10) Patent No.: US 8,644,655 B2
(45) Date of Patent: Feb. 4, 2014

(54) OPTO-ELECTRIC HYBRID BOARD AND MANUFACTURING METHOD THEREFOR

(75) Inventors: Yuichi Tsujita, Ibaraki (JP); Masayuki Hodono, Ibaraki (JP); Akiko Nagafuji, Ibaraki (JP); Masami Inoue, Ibaraki (JP); Ryusuke Naito, Ibaraki (JP); Mitsuru Honjo, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 138 days.

(21) Appl. No.: 13/407,009

(22) Filed: Feb. 28, 2012

(65) Prior Publication Data

US 2012/0237159 A1    Sep. 20, 2012

Related U.S. Application Data

(60) Provisional application No. 61/473,548, filed on Apr. 8, 2011.

(30) Foreign Application Priority Data

Mar. 14, 2011   (JP) .................................. 2011-055420

(51) Int. Cl.
  *G02B 6/12*   (2006.01)
(52) U.S. Cl.
  USPC ......................................................... 385/14
(58) Field of Classification Search
  USPC ......................................................... 385/14
  See application file for complete search history.

(56) References Cited

U.S. PATENT DOCUMENTS

2011/0007998 A1*   1/2011  Yamamoto et al. ............. 385/14

FOREIGN PATENT DOCUMENTS

| JP | 05-196831 A | 8/1993 |
| JP | 2009-223063 A | 10/2009 |

\* cited by examiner

*Primary Examiner* — Ryan Lepisto
*Assistant Examiner* — Jerry Blevins
(74) *Attorney, Agent, or Firm* — Westerman, Hattori, Daniels & Adrian, LLP

(57) ABSTRACT

Provided are an opto-electric hybrid board which eliminates the necessity of an aligning operation of a core of an optical waveguide unit and an optical element of an electric circuit unit and which is excellent in mass-productivity, and a manufacturing method therefor. The opto-electric hybrid board includes an optical waveguide unit and an electric circuit unit having an optical element mounted thereon, the electric circuit unit being coupled to the optical waveguide unit. The optical waveguide unit includes protruding portions which are extendingly provided at portions of at least one of the undercladding layer and the overcladding layer, and are located and formed at predetermined locations with respect to a light transmitting surface of a core. The electric circuit unit includes fitting holes into which the protruding portions fit, and are located and formed at predetermined locations with respect to the optical element.

4 Claims, 10 Drawing Sheets

OPTO-ELECTRIC HYBRID BOARD AND MANUFACTURING METHOD THEREFOR

RELATED APPLICATIONS

This application claims the benefit of U.S. Provisional Application No. 61/473,548 filed on Apr. 8, 2011, which is hereby incorporated by reference.

BACKGROUND OF THE INVENTION

1. Field of the Invention

The present invention relates to an opto-electric hybrid board which includes an optical waveguide unit and an electric circuit unit having an optical element mounted thereon, and to a manufacturing method therefor.

2. Description of the Related Art

In recent electronic devices or the like, as the amount of transmission information increases, in addition to electric wiring, optical wiring is adopted. More specifically, an opto-electric hybrid board including an electric circuit unit in which an optical element such as a light-emitting element for converting an electrical signal into an optical signal or a light-receiving element for converting an optical signal into an electrical signal is mounted on an electric circuit board having electric wiring formed thereon, and an optical waveguide unit in which an optical waveguide as optical wiring for transmitting the optical signal is formed is incorporated in the electronic device or the like.

In the opto-electric hybrid board, light which is emitted from the light-emitting element is required to enter one end surface (light entrance) of a core (optical wiring) of the optical waveguide unit, and light which exits the other end surface (light exit) of the core is required to be received by the light-receiving element. Therefore, it is necessary that the optical element (the light-emitting element or the light-receiving element) and the core be aligned with each other.

Accordingly, methods of aligning the optical element and the core are conventionally proposed. In an exemplary method, an optical waveguide unit is fixed and, under a state in which light is emitted from a light-emitting element to one end surface (light entrance) of a core of the optical waveguide unit while the location of the light-emitting element is changed, the intensity of light which exits from the other end surface (light exit) of the core is monitored, and the location at which the intensity becomes the highest is determined as the alignment location (see JP-A1-HEI5(1993)-196831). In another exemplary method, a connector having holes for locating formed therein is attached to an optical waveguide unit, pins for locating, which fit into the holes, are attached to an electric circuit unit, and, by fitting the pins into the holes, respectively, an optical element and a core of the optical waveguide unit are automatically aligned (see JP-A1-2009-223063).

However, in the aligning method described in JP-A1-HEI5(1993)-196831 above, although alignment with high accuracy is possible, it takes time and effort, and thus, the method lacks mass-productivity. Further, in the aligning method described in JP-A1-2009-223063 above, although position adjustment may be carried out in a simple method of fitting the pins into the holes, respectively, not only dimensional deviations are caused when the connector and the pins are respectively manufactured but also misalignment of the attachment location of the connector with respect to the optical waveguide unit, misalignment of the attachment location of the pins for locating with respect to the electric circuit unit, and the like are caused. Accumulation of those dimensional deviations and misalignments lowers the accuracy of the alignment. If enhancement of the accuracy of the alignment is attempted, control of the dimensional accuracy is necessary so that the dimensional deviations and misalignments are not caused, and thus the cost increases and the method lacks mass-productivity.

SUMMARY OF THE INVENTION

An opto-electric hybrid board is provided which eliminates the necessity of an aligning operation of a core of an optical waveguide unit and an optical element of an electric circuit unit and which is excellent in mass-productivity. A manufacturing method therefor is also provided.

An opto-electric hybrid board is provided including: an optical waveguide unit; and an electric circuit unit having an optical element mounted thereon, the electric circuit unit being coupled to the optical waveguide unit, in which: the optical waveguide unit includes: an undercladding layer; a core for an optical path, which is formed on a surface of the undercladding layer; an overcladding layer which covers the core; and a protruding portion for locating the electric circuit unit which is extendingly provided at a portion of at least one of the undercladding layer and the overcladding layer; the electric circuit unit includes: an electric circuit board; the optical element mounted at a predetermined portion on the electric circuit board and a fitting hole into which the protruding portion fits; the protruding portion of the optical waveguide unit is located and formed at a predetermined location with respect to a light transmitting surface of the core; the fitting hole of the electric circuit unit is located and formed at a predetermined location with respect to the optical element; and the optical waveguide unit and the electric circuit unit are coupled to each other in a state in which the protruding portion of the optical waveguide unit fits into the fitting hole of the electric circuit unit.

Further, there is provided a manufacturing method for an opto-electric hybrid board in which an optical waveguide unit and an electric circuit unit having an optical element mounted thereon are coupled, the method including: manufacturing the optical waveguide unit including: forming an undercladding layer; forming, on a surface of the undercladding layer, a core for an optical path; and forming an overcladding layer so as to cover the core, at least one of the forming an undercladding layer and the forming an overcladding layer including extendingly providing a protruding portion for locating the electric circuit unit at a predetermined location located with respect to a light transmitting surface of the core; manufacturing the electric circuit unit including: forming an electric circuit board; and mounting the optical element at a predetermined portion on the electric circuit board, the forming an electric circuit board including forming a fitting hole into which the protruding portion fits at a predetermined location located with respect to an expected mounting location of the optical element; and coupling the optical waveguide unit and the electric circuit unit to manufacture the opto-electric hybrid board, the coupling including fitting the protruding portion of the optical waveguide unit into the fitting hole of the electric circuit unit.

The optical waveguide unit and the electric circuit unit having the optical element mounted thereon are coupled. In the optical waveguide unit, a light transmitting surface of a core and a protruding portion for locating the electric circuit unit are in a positional relationship of being located with respect to each other. Further, in the electric circuit unit, the optical element and a fitting hole into which the protruding portion of the optical waveguide unit fits are in a positional relationship of being located with respect to each other. Therefore, in a state in which the protruding portion of the optical waveguide unit fits into the fitting hole of the electric circuit unit, that is, in a state in which the optical waveguide unit and the electric circuit unit are coupled to each other, the core of the optical waveguide unit and the optical element of the electric circuit unit are automatically aligned. In addition, the protruding portion of the optical waveguide unit is provided by extending a predetermined portion of at least one of an undercladding layer and an overcladding layer which form the optical waveguide unit, while the fitting hole of the electric circuit unit is formed in the electric circuit unit. Therefore, an additional component such as a connector is not provided for fitting the protruding portion into the fitting hole. Therefore, in the coupling between the optical waveguide unit and the electric circuit unit, there is no accumulation of dimensional deviations and misalignments due to such additional components including a connector, and the core of the optical waveguide unit and the optical element of the electric circuit unit are aligned with high accuracy. As described above, in the opto-electric hybrid board, the core and the optical element are formed to be automatically aligned with high accuracy by a simple operation of fitting the protruding portion of the optical waveguide unit into the fitting hole of the electric circuit unit, and thus an aligning operation which takes time and effort is not necessary and the opto-electric hybrid board is excellent in mass-productivity. Further, an additional component such as a connector is not necessary for fitting the protruding portion into the fitting hole, and thus control of the dimensional accuracy of the connector or the like is not necessary. Also in this regard, the opto-electric hybrid board is excellent in mass-productivity.

In particular, in a case where a second protruding portion is extendingly provided at a portion of the optical waveguide unit which is different from the protruding portion and a second fitting hole into which the second protruding portion fits is formed in a portion of the electric circuit unit which is different from the fitting hole, by fitting the second protruding portion of the optical waveguide unit into the second fitting hole of the electric circuit unit, misalignment of the optical waveguide unit with respect to the electric circuit unit is prevented with greater reliability, and thus the alignment between the core and the optical element may be maintained with greater reliability.

The manufacturing method for the opto-electric hybrid board is carried out by coupling an optical waveguide unit and an electric circuit unit having an optical element mounted thereon. In a step of manufacturing the optical waveguide unit, a protruding portion for locating the electric circuit unit is extendingly provided at a predetermined location which is located with respect to a light transmitting surface of a core. Further, in a step of manufacturing the electric circuit unit, a fitting hole into which the protruding portion of the optical waveguide unit fits is formed at a predetermined location which is located with respect to the optical element. Therefore, by fitting the protruding portion of the optical waveguide unit into the fitting hole of the electric circuit unit to couple the optical waveguide unit and the electric circuit unit to each other, the core of the optical waveguide unit and the optical element of the electric circuit unit may be automatically aligned. In addition, the protruding portion of the optical waveguide unit is formed by extending a predetermined portion of at least one of an undercladding layer and an overcladding layer which form the optical waveguide unit, while the fitting hole of the electric circuit unit is formed in a part of an electric circuit board which forms the electric circuit unit. Therefore, an additional component such as a connector is not necessary for fitting the protruding portion into the fitting hole. Therefore, in the coupling between the optical waveguide unit and the electric circuit unit, there is no accumulation of dimensional deviations and misalignments due to such an additional component including a connector, and the core of the optical waveguide unit and the optical element of the electric circuit unit are aligned with high accuracy. As described above, in the manufacturing method for the opto-electric hybrid board, the core and the optical element are automatically aligned with high accuracy by a simple operation of fitting the protruding portion of the optical waveguide unit into the fitting hole of the electric circuit unit, and thus an aligning operation which takes time and effort is not necessary and the method is excellent in mass-productivity. Further, an additional component such as a connector is not necessary for fitting the protruding portion into the fitting hole, and thus control of the dimensional accuracy of the connector or the like is not necessary. Also in this regard, the method is excellent in mass-productivity.

In particular, in a case where a second protruding portion is extendingly provided at a portion of the optical waveguide unit which is different from the protruding portion and a second fitting hole into which the second protruding portion fits is formed in a portion of the electric circuit unit which is different from the fitting hole, by fitting the second protruding portion of the optical waveguide unit into the second fitting hole of the electric circuit unit, misalignment of the optical waveguide unit with respect to the electric circuit unit is prevented with greater reliability.

BRIEF DESCRIPTION OF THE DRAWINGS

FIG. 13A and FIG. 13B schematically illustrate the optical waveguide unit in still another form, of which FIG. 13A is a front view thereof and FIG. 13B is a sectional view taken along the line B-B of FIG. 13A.

DETAILED DESCRIPTION OF THE INVENTION

Next, embodiments of the present invention are described in detail with reference to the drawings.

Figure 1:
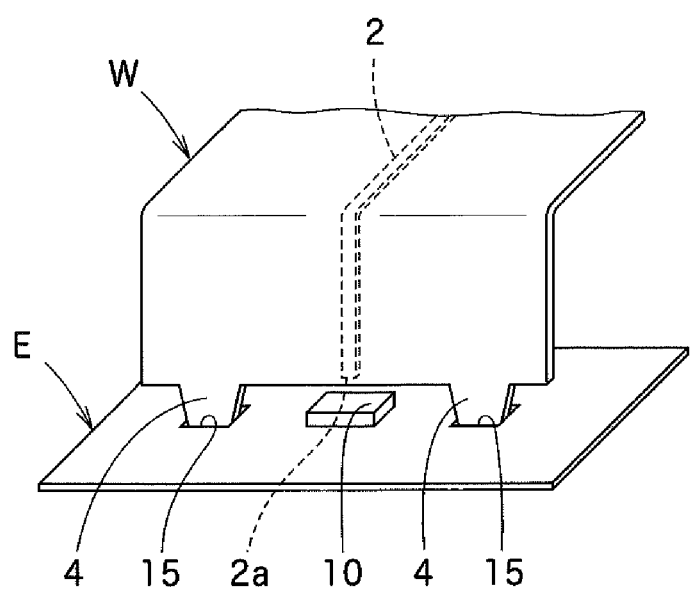
FIG. 1 is a perspective view schematically illustrating a first embodiment of an opto-electric hybrid board.

FIG. 1 is a perspective view schematically illustrating a first embodiment of an opto-electric hybrid board. In the opto-electric hybrid board, an optical waveguide unit W having protruding portions 4 for locating an electric circuit unit, and an electric circuit unit E having fitting holes 15 into which the protruding portions 4 fit, respectively, are separately manufactured, and the optical waveguide unit W and the electric circuit unit E are coupled to be integral by fitting the protruding portions 4 of the optical waveguide unit W into the fitting holes 15 of the electric circuit unit E, respectively. Here, in the optical waveguide unit W, the protruding portions 4 are located and formed at predetermined locations with respect to a light transmitting surface (one end surface) 2a of a core 2 (at locations which are set in advance so that, when the units W and E are coupled, the light transmitting surface 2a of the optical waveguide unit W faces an optical element 10 of the electric circuit unit E). Further, in the electric circuit unit E, the fitting holes 15 into which the protruding portions 4 fit, respectively, are located and formed at predetermined locations with respect to the optical element 10 (at locations which are set in advance so that, when the units W and E are coupled, the optical element 10 of the electric circuit unit E faces the light transmitting surface 2a of the optical waveguide unit W). Therefore, in the opto-electric hybrid board, by fitting the protruding portions 4 into the fitting holes 15, respectively, the light transmitting surface 2a of the core 2 and the optical element 10 are appropriately located in an aligned state. Note that, in this embodiment, the optical waveguide unit W is coupled to the electric circuit unit E in a bent state.

Figure 2A:
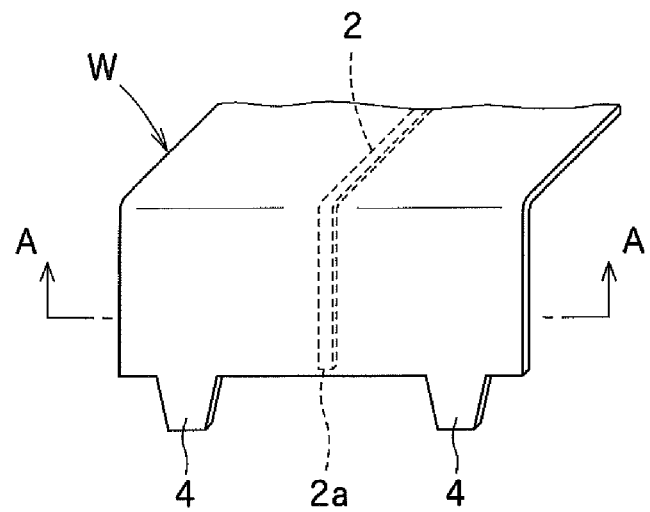
FIG. 2A is a perspective view schematically illustrating an optical waveguide unit which forms the opto-electric hybrid board.
Figure 2B:
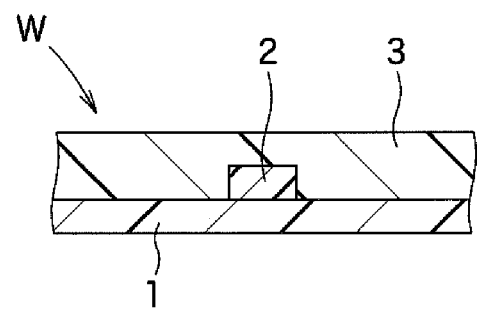
FIG. 2B is an enlarged sectional view of a principal part taken along the line A-A of FIG. 2A.

Description is made in more detail. The optical waveguide unit W includes an undercladding layer 1, the core 2 for an optical path formed on a surface of the undercladding layer 1 in a predetermined linear pattern, and an overcladding layer 3 formed on the surface of the undercladding layer 1 so as to cover the core 2 as illustrated in FIG. 2A as a perspective view and in FIG. 2B as an enlarged sectional view of a principal part taken along the line A-A of FIG. 2A. At one edge of the optical waveguide unit W (lower edge in FIG. 2A), stacked portions of the undercladding layer 1 and the overcladding layer 3 at which the core 2 does not exist are extended along an axial direction of the core 2, and the extended portions are formed into the protruding portions 4 for locating the electric circuit unit. The protruding portions 4 are located and formed at the predetermined locations with respect to the light transmitting surface 2a of the core 2. In this embodiment, the protruding portions 4 are arranged on both sides of the core 2 (in two places), and the protruding portions 4 are shaped so that the thickness (thickness in a direction of the stack of the undercladding layer 1 and the overcladding layer 3) thereof is constant and the width thereof gradually decreases in a direction of the extension and so as to be trapezoidal in front view.

Figure 3:
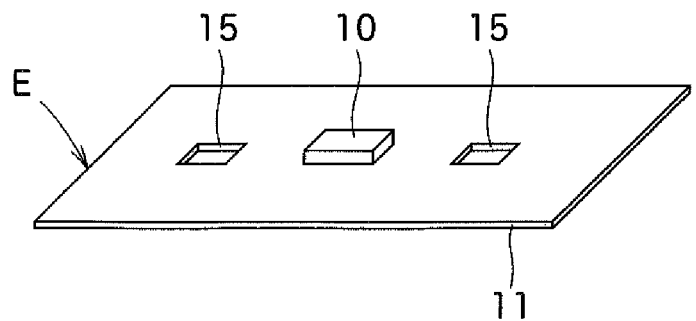
FIG. 3 is a perspective view schematically illustrating an electric circuit unit which forms the opto-electric hybrid board.

On the other hand, the electric circuit unit E includes a substrate 11, and the optical element 10 and a drive IC which are mounted on a surface of the substrate 11 via an insulating layer (not shown), as illustrated in FIG. 3 as a perspective view. In the electric circuit unit E, the fitting holes 15 are formed, into which the protruding portions 4 of the optical waveguide unit W (see FIG. 2A) fit, respectively. The fitting holes 15 are located and formed at the predetermined locations with respect to the optical element 10. In this embodiment, the fitting holes 15 are arranged on both sides of the optical element 10 (in two places), and the fitting holes 15 are shaped so as to be rectangular in plan view.

Note that, the insulating layer is formed on the surface of the substrate 11 except for the fitting holes 15. On the surface of the insulating layer, there are formed an electric circuit (not shown) which is connected to the drive IC, and further, an optical element location defining electrode (not shown) used as a guide when the optical element 10 is located and formed, and fitting hole locating circuits (not shown) used as guides when the fitting holes 15 are located and formed. The fitting hole locating circuits are formed on the periphery of the fitting holes 15, respectively, so as to be frame-like. Further, a plating layer (not shown) is formed on surfaces of the electric circuit, the optical element location defining electrode, and the fitting hole locating circuits. The optical element location defining electrode is formed substantially at the center of the surface of the insulating layer, and the optical element 10 is mounted at a predetermined location with respect to the optical element location defining electrode. The optical element 10 and the drive IC are electrically connected to each other by wire bonding, and the drive IC and an electrode pad (a part of the electric circuit) are electrically connected to each other by wire bonding. With this state, the optical element 10 and portions therearound are encapsulated in resin (not shown). In this embodiment, a wire bonding type element is used as the optical element 10, and a light-emitting portion or a light-receiving portion thereof is formed on a surface (upper surface in FIG. 3) of the optical element 10. Note that, the drive IC is, for example, a driver for driving a light-emitting element (optical element 10) or a trans-impedance amplifier (TIA) for amplifying a signal from a light-receiving element (optical element 10).

In the opto-electric hybrid board, as illustrated in FIG. 1, the optical waveguide unit W and the electric circuit unit E are coupled to be integral in a state in which the protruding portions 4 of the optical waveguide unit W fit into the fitting holes 15 of the electric circuit unit E. Here, as described above, the protruding portions 4 formed in the optical waveguide unit W are located and formed at the predetermined locations with respect to the light transmitting surface 2a of the core 2. Further, the fitting holes 15 formed in the electric circuit unit E are located and formed at the predetermined locations with respect to the optical element 10. Therefore, by fitting the protruding portions 4 into the fitting holes 15, the light transmitting surface 2a of the core 2 and the optical element 10 are appropriately located in an aligned state automatically.

Further, in this embodiment, the protruding portions 4 of the optical waveguide unit W are formed so as to be trapezoidal, and thus, by setting the length of the openings of the rectangular fitting holes 15 of the electric circuit unit E at a predetermined value, inclined surfaces of each of the trapezoidal protruding portions 4, which are opposed to each other, may be caused to abut against both surfaces of each of the rectangular fitting holes 15, which are opposed to each other, to thereby appropriately set the fitting amount (fitting depth) of the protruding portions 4. Further, with this setting, the distance between the one end surface of the optical waveguide unit W (light transmitting surface 2a of the core 2) and the optical element 10 of the electric circuit unit E may be appropriately set. Further, even when the widths of the protruding portions 4, the lengths of the openings of the fitting holes 15, and the like are, for example, dimensionally contracted, by using the inclined surfaces of each of the trapezoidal protruding portions 4, which are opposed to each other, the protruding portions 4 may coaxially fit into the fitting holes 15, respectively, to thereby prevent misalignment between the core 2 and the optical element 10. Note that, in FIG. 1, for the sake of easy understanding, the fitting holes 15 are illustrated so as to be a significantly larger in size than the protruding portions 4, but in reality, the fitting holes 15 have a size similar to that of or slightly larger than the protruding portions 4.

The opto-electric hybrid board is manufactured through the following steps (1) to (3):

(1) a step of manufacturing the optical waveguide unit W (see FIGS. 4A to 4D);
(2) a step of manufacturing the electric circuit unit E (see FIGS. 5A to 5F); and
(3) a step of coupling the optical waveguide unit W to the electric circuit unit E.

<(1) Step of Manufacturing Optical Waveguide Unit W>

The step of manufacturing the optical waveguide unit W of the above-mentioned item (1) is described. First, a plate-like base 20 (see FIG. 4A) used when the undercladding layer 1 is formed is prepared. The forming material for the base 20 is, for example, glass, quartz, silicon, a resin, or a metal. Among them, a substrate formed of a stainless steel is preferred, because a substrate formed of a stainless steel is excellent in resistance to expansion and contraction due to heat and various dimensions thereof are substantially maintained at design values in the process of manufacturing the optical waveguide unit W. Further, the thickness of the base 20 is set within a range of, for example, 20 μm to 1 mm.

Figure 4A:
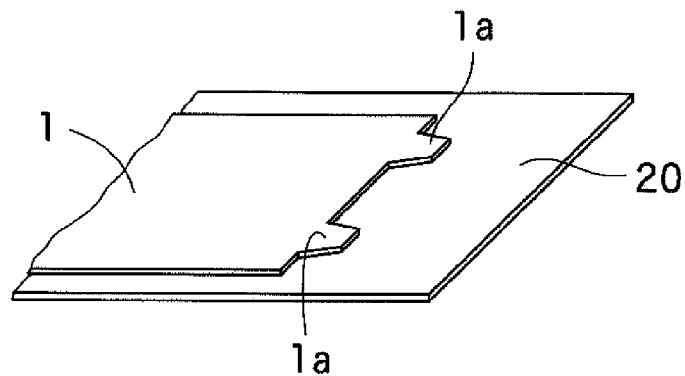
FIGS. 4A to 4D are explanatory views schematically illustrating manufacturing steps for the optical waveguide unit in a manufacturing method for the opto-electric hybrid board.

Next, as illustrated in FIG. 4A, the undercladding layer 1 is formed by photolithography in a predetermined region on a surface of the base 20, the undercladding layer 1 having in two places at one edge thereof protruding pieces 1a which are trapezoidal in plan view. As the forming material for the undercladding layer 1, a photosensitive resin such as a photosensitive epoxy resin is used. The thickness of the undercladding layer 1 is set within a range of, for example, 5 to 50 μm.

Figure 4B:
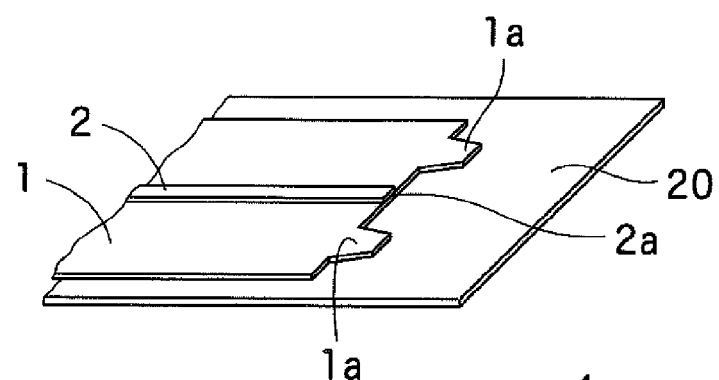

Then, as illustrated in FIG. 4B, the core 2 in the predetermined pattern is formed by photolithography on the surface of the undercladding layer 1. Here, the light transmitting surface (one end surface) 2a of the core 2 is located at a predetermined location between the protruding pieces 1a in the two places on the surface of the undercladding layer 1 with reference to the protruding pieces 1a in the two places. The locating of the core 2 is carried out by, under a state in which a photomask formed with reference to the protruding pieces 1a in the two places is placed with respect to the protruding pieces 1a in the two places, performing exposure via the photomask when the core 2 is formed by photolithography.

The forming material for the core 2 is, for example, a photosensitive resin similar to the case of the undercladding layer 1, and a material having the refractive index higher than those of forming materials for the undercladding layer 1 and the overcladding layer 3 (see FIG. 4C) is used. The adjustment of the refractive index may be made by, for example, selecting the kinds of and adjusting the composition ratios of the forming materials for the undercladding layer 1, the core 2, and the overcladding layer 3. The number of the cores may be one or more than one (one in the case illustrated in FIG. 4B). The pattern of the core 2 is, for example, in the shape of a straight line, branched, or crossed, or may be a combination thereof (in the shape of a straight line in the case illustrated in FIG. 4B). The thickness of the core 2 is set within a range of, for example, 20 to 100 μm. The width of the core 2 is set within a range of, for example, 20 to 100 μm.

Figure 4C:
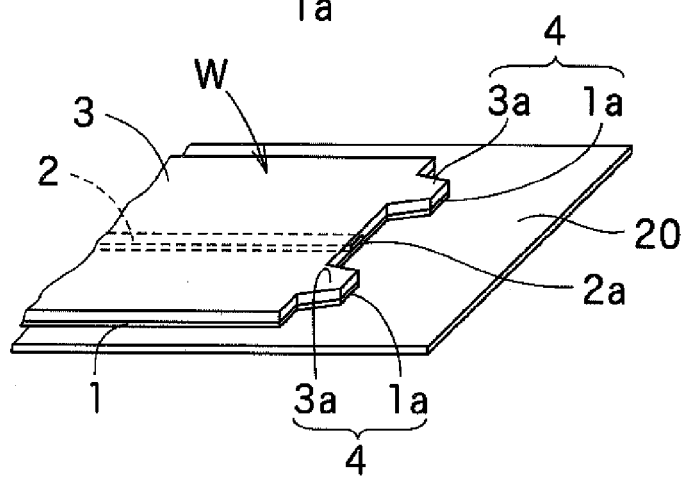

Then, as illustrated in FIG. 4C, the overcladding layer 3 is formed by photolithography on the surface of the undercladding layer 1 so as to cover the core 2. Here, protruding pieces 3a in the same shape as that of the protruding pieces 1a are formed on the protruding pieces 1a of the undercladding layer 1. The forming material for the overcladding layer 3 is, for example, a photosensitive resin similar to the case of the undercladding layer 1. The thickness of the overcladding layer 3 (thickness from the surface of the undercladding layer 1) is set within a range of, for example, a thickness greater than the thickness of the core 2 and a thickness of 1,000 μm or smaller.

Here, stacked portions of the protruding pieces 1a of the undercladding layer 1 and the protruding pieces 3a of the overcladding layer 3 formed thereon are the protruding portions 4 for locating the electric circuit unit. As described above, the light transmitting surface 2a of the core 2 is located and formed at the predetermined location with respect to the protruding pieces 1a of the undercladding layer 1, and thus, the protruding portions 4 formed by stacking the protruding pieces 3a of the overcladding layer on the protruding pieces 1a are located and formed at the predetermined locations with respect to the light transmitting surface 2a of the core 2. With regard to the dimensions of the protruding portions 4, the amount of the protrusions is set within a range of, for example, 300 to 5,000 μm, and the width is set within a range of 100 to 5,000 μm.

Figure 4D:
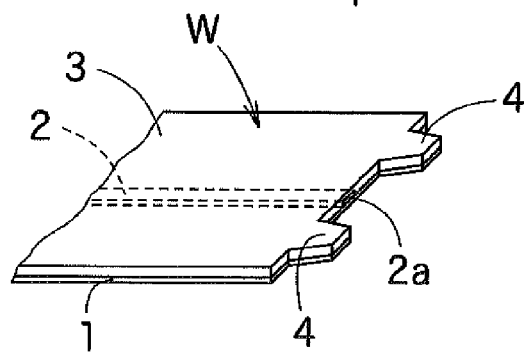

Then, as illustrated in FIG. 4D, the base 20 (see FIG. 4C) is separated from a rear surface of the undercladding layer 1. With the separation, the optical waveguide unit W is obtained, which includes the undercladding layer 1, the core 2, and the overcladding layer 3 and in which the protruding portions 4 for locating the electric circuit unit are provided by extending the stacked portions of the undercladding layer 1 and the overcladding layer 3. The thickness of the optical waveguide unit W is set within a range of, for example, 30 to 1,150 μm. In this way, the step of manufacturing the optical waveguide unit W of the above-mentioned item (1) is completed.

<(2) Step of Manufacturing Electric Circuit Unit E>

Next, the step of manufacturing the electric circuit unit E of the above-mentioned item (2) is described. First, the substrate 11 (see FIG. 5A) is prepared. The forming material for the substrate 11 is, for example, a metal or a resin. Among them, a substrate formed of a stainless steel is preferred from the viewpoint of easy processability and dimensional stability. Further, the thickness of the substrate 11 is set within a range of, for example, 0.02 to 0.1 mm.

Figure 5A:
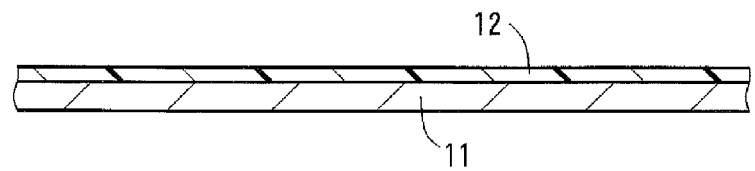
FIGS. 5A to 5F are explanatory views schematically illustrating manufacturing steps for the electric circuit unit in the manufacturing method for the opto-electric hybrid board.

Then, as illustrated in FIG. 5A, an insulating layer 12 is formed in a predetermined region of the surface of the substrate 11. With regard to the formation of the insulating layer 12, for example, varnish in which a photosensitive resin such as a photosensitive polyimide resin for forming an insulating layer is dissolved in a solvent is applied, and then, as necessary, the layer formed by applying the varnish is dried by heating treatment to form a photosensitive resin layer for forming the insulating layer. Then, by exposing the photosensitive resin layer to a radiation ray such as an ultraviolet ray via a photomask, the insulating layer 12 in a predetermined shape is formed. The thickness of the insulating layer 12 is set within a range of, for example, 5 to 15 μm.

Figure 5B:
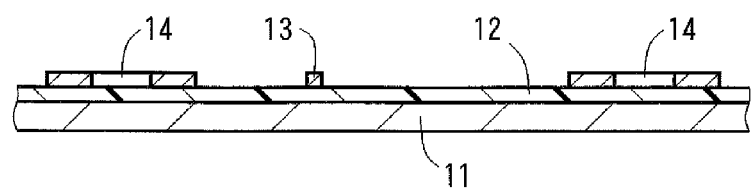

Then, as illustrated in FIG. 5B, the electric circuit (not shown), an optical element location defining electrode 13, and frame-like fitting hole locating circuits 14 are simultaneously formed on a surface of the insulating layer 12, to thereby manufacture an electric circuit board. The formation of the electric circuit and the like is carried out by, for example, a semi-additive process.

More specifically, first, a metal layer (having a thickness of about 60 to 260 nm) is formed on the surface of the insulating layer 12 by sputtering, electroless plating, or the like. The metal layer becomes a seed layer when electrolytic plating is applied later (layer to be a base metal when an electrolytic plating layer is formed). Then, after dry film resists are adhered to both surfaces of a laminate including the substrate 11, the insulating layer 12, and the seed layer, hole portions of the pattern of the electric circuit and the like are simultaneously formed by photolithography in the dry film resist on a side having the seed layer formed thereon, and surface portions of the seed layer are exposed at the bottom of the hole portions. Then, an electrolytic plating layer (having a thickness of about 5 to 20 μm) is stacked by electrolytic plating on the surface portions of the seed layer exposed at the bottom of the hole portions. Then, the dry film resists are separated by a sodium hydroxide solution or the like. After that, portions of the seed layer which do not have the electrolytic plating layer formed thereon are removed by soft etching, and a stacked portion including the remaining electrolytic plating layer and the seed layer thereunder is formed into the electric circuit and the like. In this way, the electric circuit board is obtained, which includes the substrate 11, the insulating layer 12, the electric circuit, the optical element location defining electrode 13, and the frame-like fitting hole locating circuits 14.

Figure 5C:
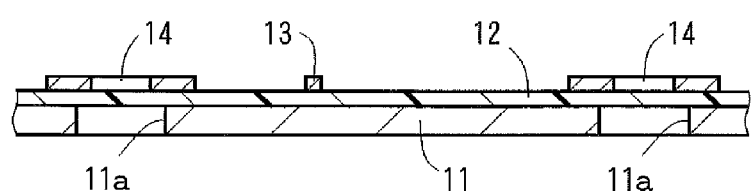

Then, the electric circuit board is set in an exposure machine, an image of a front surface side (electric circuit side) and an image of a rear surface side (substrate 11 side) are taken by a camera. Based on the images, the locations of expected fitting hole forming portions on the rear surface side (portions corresponding to within the frames of the frame-like fitting hole locating circuits 14) are appropriately located with the frame-like fitting hole locating circuits 14 on the front surface side being used as guides. Then, the rear surface portion except for the expected fitting hole forming portions is covered with a dry film resist (not shown). Then, as illustrated in FIG. 5C, the exposed portions of the substrate 11 at the expected fitting hole forming portions are removed by etching using a ferric chloride solution. The etching exposes the portions of the insulating layer 12 from portions 11a removed by the etching.

Figure 5D:
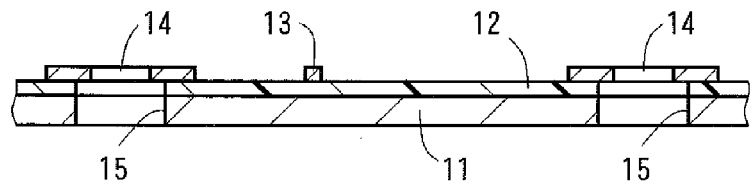

Then, as illustrated in FIG. 5D, the exposed portions of the insulating layer 12 are removed by etching using a chemical etchant. The etching forms the expected fitting hole forming portions into the fitting holes 15. The fitting holes 15 are formed with reference to the frame-like fitting hole locating circuits 14 which are formed simultaneously with the optical element location defining electrode 13 by the semi-additive process, and thus the fitting holes 15 are located and formed at predetermined locations with respect to the optical element location defining electrode 13. The length and width of the openings of the fitting holes 15 are set to be equivalent to or slightly larger (by, for example, about 1 to 100 μm) than the length and width of the fitting portions of the protruding portions 4 (see FIG. 1) of the optical waveguide unit W which fit into the fitting holes 15.

Figure 5E:
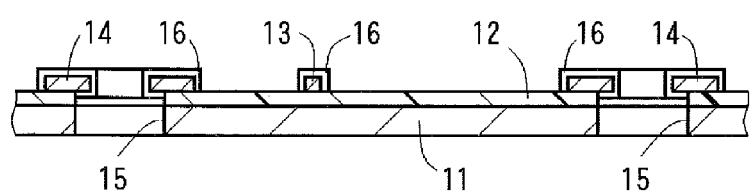

Then, by performing electrolytic plating processing, as illustrated in FIG. 5E, a plating layer 16 is formed on surfaces of the electric circuit, the optical element location defining electrode 13, and the fitting hole locating circuits 14. After that, the dry film resist is separated by a sodium hydroxide solution or the like. Note that, examples of the component of the plating layer 16 include gold, nickel, or the like. Further, the thickness of the plating layer 16 is ordinarily set within a range of, for example, 0.2 to 0.5 μm.

Figure 5F:
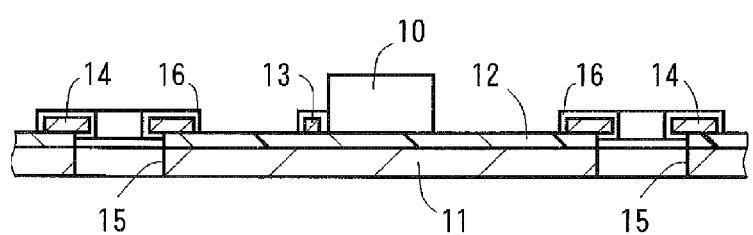

Then, as illustrated in FIG. 5F, the optical element 10 and the drive IC (not shown) are mounted (die bonded) at the predetermined location with reference to the optical element location defining electrode 13. Next, the optical element 10 and the drive IC are electrically connected to each other by wire bonding, and the drive IC and the electrode pad (a part of the electric circuit) are electrically connected to each other by wire bonding. After that, the optical element 10 and portions therearound are encapsulated in resin (not shown). In this way, the electric circuit unit E having the fitting holes 15 formed therein is obtained. Here, as described above, the fitting holes 15 formed in the step illustrated in FIG. 5D are located and formed at the predetermined locations with respect to the optical element location defining electrode 13, and hence the optical element 10 mounted at the predetermined location with respect to the optical element location defining electrode 13 and the fitting holes 15 are in a positional relationship of being located with respect to each other. In this way, the step of manufacturing the electric circuit unit E of the above-mentioned item (2) is completed.

<(3) Step of Coupling Optical Waveguide Unit W and Electric Circuit Unit E>

Next, the step of coupling the optical waveguide unit W and the electric circuit unit E is described. In this coupling, under a state in which the optical element 10 of the electric circuit unit E and the light transmitting surface 2a of the core 2 of the optical waveguide unit W face each other, the protruding portions 4 of the optical waveguide unit W are caused to fit into the fitting holes 15 of the electric circuit unit E to integrate the optical waveguide unit W and the electric circuit unit E (see FIG. 1). After that, as necessary, the portions at which the protruding portions 4 fit into the fitting holes 15, respectively, may be fixed with an adhesive. Then, the optical waveguide unit W is bent as illustrated in FIG. 1. In this way, the step of coupling the optical waveguide unit W and the electric circuit unit E of the above-mentioned item (3) is completed, and the opto-electric hybrid board is completed which is the goal.

Here, as described above, in the optical waveguide unit W, the light transmitting surface 2a of the core 2 and the protruding portions 4 for locating the electric circuit unit are in a positional relationship of being located with respect to each other. Further, in the electric circuit unit E having the optical element 10 mounted thereon, the optical element 10 and the fitting holes 15 into which the protruding portions 4 fit, respectively, are in a positional relationship of being located with respect to each other. Therefore, when the protruding portions 4 are caused to fit into the fitting holes 15, respectively, as described above to manufacture the opto-electric hybrid board, the light transmitting surface 2a of the core 2 and the optical element 10 are automatically aligned. As a result, in manufacturing the opto-electric hybrid board, an aligning operation which takes time and effort is not necessary. In other words, the opto-electric hybrid board is excellent in mass-productivity.

In addition, the protruding portions 4 of the optical waveguide unit W are provided by extending predetermined portions of the undercladding layer 1 and the overcladding layer 3 which form the optical waveguide unit W. Further, the fitting holes 15 of the electric circuit unit E are formed in the electric circuit board which forms the electric circuit unit E. In other words, an additional component such as a connector is not provided for the purpose of fitting the protruding portions 4 into the fitting holes 15. Therefore, in the coupling between the optical waveguide unit W and the electric circuit unit E, there is no accumulation of dimensional deviations and misalignments due to an additional component such as a connector, and the core 2 of the optical waveguide unit W and the optical element 10 of the electric circuit unit E are aligned with high accuracy. Further, an additional component such as a connector is not necessary for the fit between the protruding portions 4 and the fitting holes 15, and thus control of the dimensional accuracy of the connector or the like is not necessary. In this regard, also, the opto-electric hybrid board is excellent in mass-productivity.

Figure 6:
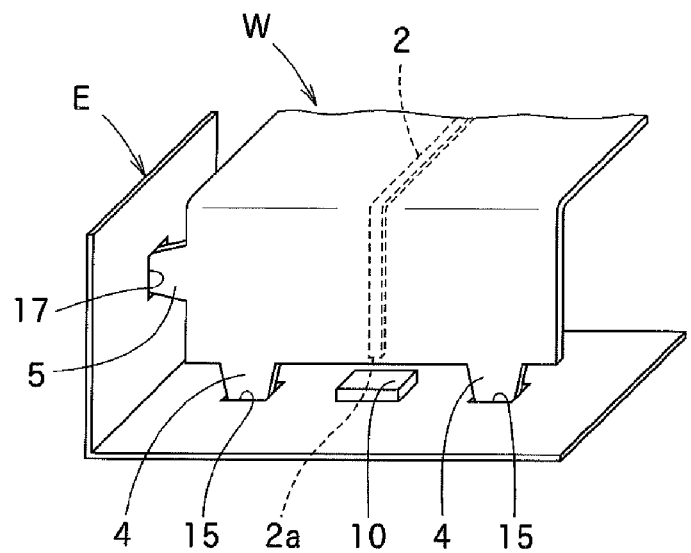
FIG. 6 is a perspective view schematically illustrating a second embodiment of the opto-electric hybrid board.

FIG. 6 is a perspective view schematically illustrating a second embodiment of the opto-electric hybrid board. In this embodiment, in the optical waveguide unit W, in addition to the protruding portions (first protruding portions) 4 at the one edge thereof, a second protruding portion 5 similar to the first protruding portions 4 is extendingly provided at one side edge of the optical waveguide unit W. Further, the electric circuit unit E includes a portion in which the fitting holes (first fitting holes) 15 into which the first protruding portions 4 fit are formed and a bent portion which is bent in a perpendicular direction. A second fitting hole 17 into which the second protruding portion 5 fits is formed in the bent portion. Other portions of the second embodiment are similar to those the first embodiment illustrated in FIG. 1, and like reference numerals are used to designate like members.

In the opto-electric hybrid board of this embodiment, the coupling of the optical waveguide unit W and the electric circuit unit E is performed not only by the fitting of the first protruding portions 4 into the first fitting holes 15 but also the fitting of the second protruding portion 5 into the second fitting hole 17, and thus misalignment of the optical waveguide unit W with respect to the electric circuit unit E may be prevented with greater reliability. The prevention of misalignment may maintain the alignment between the core 2 and the optical element 10 with greater reliability.

In this embodiment, the optical waveguide unit W may be manufactured in a similar way to the case of the first embodiment. The bent portion of the electric circuit unit E is a portion bent after the first protruding portions 4 are caused to fit into the first fitting holes 15, respectively. More specifically, in manufacturing the electric circuit unit E, under a state in which the bent portion is flush with the portion in which the first fitting holes 15 are formed, the first fitting holes 15 are formed in a similar way to the case of the first embodiment. Then, an expected fold line and the second fitting hole 17 are located and formed at predetermined locations with respect to the first fitting holes 15. Then, in the step of coupling the optical waveguide unit W and the electric circuit unit E, after the first protruding portions 4 are caused to fit into the first fitting holes 15, respectively, the bent portion of the electric circuit unit E is bent perpendicularly along the expected fold line and the second protruding portion 5 is caused to fit into the second fitting hole 17.

Figure 7:
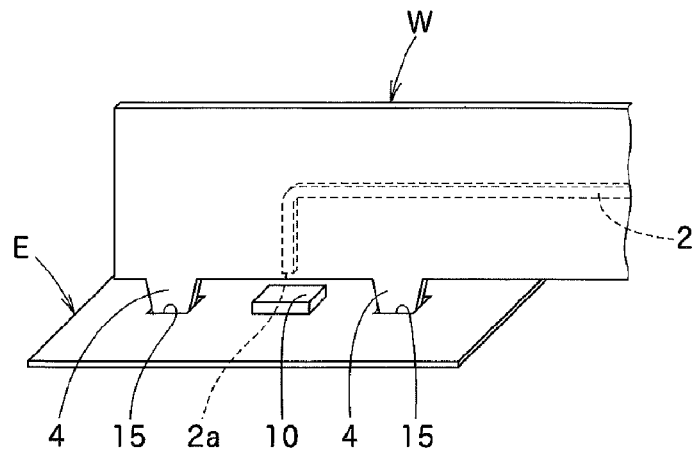
FIG. 7 is a perspective view schematically illustrating a third embodiment of the opto-electric hybrid board.

FIG. 7 is a perspective view schematically illustrating a third embodiment of the opto-electric hybrid board. In this embodiment, the core 2 of the optical waveguide unit W is curved toward one side edge of the optical waveguide unit W at one end thereof, and in accordance with the curve, the (first) protruding portions 4 which fit into the (first) fitting holes 15, respectively, of the electric circuit unit E are extendingly provided at the one side edge of the optical waveguide unit W. The other portions of the optical waveguide unit W and the electric circuit unit E are similar to those of the first embodiment illustrated in FIG. 1, and like reference numerals are used to designate like members. The third embodiment produces actions and effects similar to those of the first embodiment. Note that, with regard to the curved structure of the core 2, the curve may have, for example, a radius of curvature of 0.5 to 10 mm.

Figure 8:
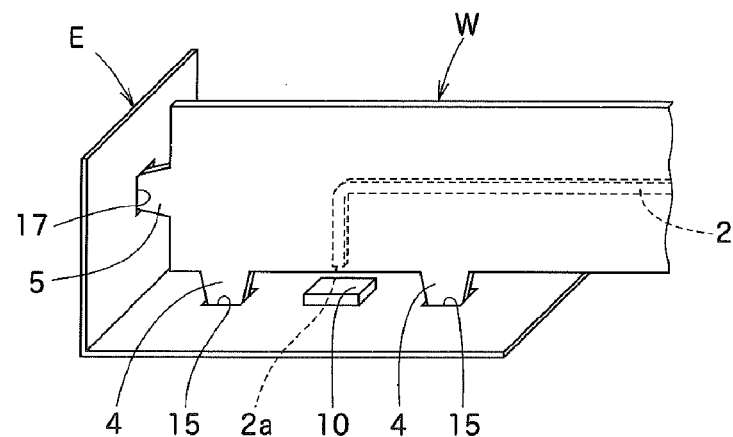
FIG. 8 is a perspective view schematically illustrating a fourth embodiment of the opto-electric hybrid board.

FIG. 8 is a perspective view schematically illustrating a fourth embodiment of the opto-electric hybrid board. In this embodiment, with regard to the third embodiment illustrated in FIG. 7, similarly to the case of the second embodiment illustrated in FIG. 6, the second protruding portion 5 and the second fitting hole 17 are formed in addition to the first protruding portions 4 and the first fitting holes 15, and the first protruding portions 4 are caused to fit into the first fitting holes 15 and the second protruding portion 5 is caused to fit into the second fitting hole 17. This embodiment also produces actions and effects similar to those of the second embodiment.

Figure 9A:
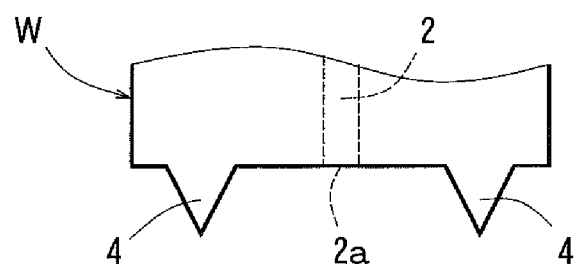
FIGS. 9A and 9B are front views schematically illustrating modification examples of protruding portions for positioning the electric circuit unit formed in the optical waveguide unit.
Figure 9B:
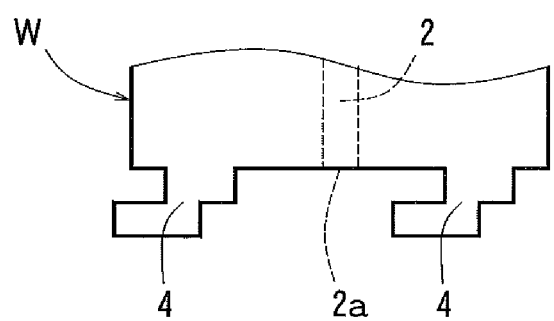

FIGS. 9A and 9B are front views schematically illustrating modification examples of the protruding portions 4 for locating the electric circuit unit. Specifically, in FIG. 9A, the protruding portions 4 are formed so as to be triangular. In this case, similarly to the case of the trapezoidal protruding portions 4 illustrated in FIG. 1, inclined surfaces of the triangles may be used to appropriately set the distance between the one end surface of the optical waveguide unit W (light transmitting surface 2a of the core 2) and the optical element 10 of the electric circuit unit E, and also, misalignment between the core 2 and the optical element 10 may be prevented (see FIG. 1). In FIG. 9B, the protruding portions 4 are formed so as to be stepped. In this case, after the protruding portions 4 fit into the fitting holes 15 (see FIG. 1), the protruding portions 4 are less liable to come out of the fitting holes 15. In addition to the above, for example, the protruding portions 4 may be formed so as to be semicircular.

FIGS. 10A to 10D schematically illustrate a method using molding as another manufacturing step (manufacturing method) for the overcladding layer 3 including the protruding pieces 3a (see FIG. 4C) in manufacturing the optical waveguide unit W. Specifically, in the above-mentioned respective embodiments, the overcladding layer 3 including the protruding pieces 3a is formed by photolithography, but the overcladding layer 3 may be formed by molding, which is carried out as follows.

Figure 10A:
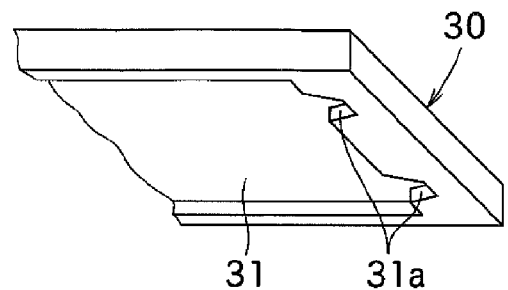
FIGS. 10A to 10D are explanatory views schematically illustrating another series of manufacturing steps for the optical waveguide unit.
Figure 10B:
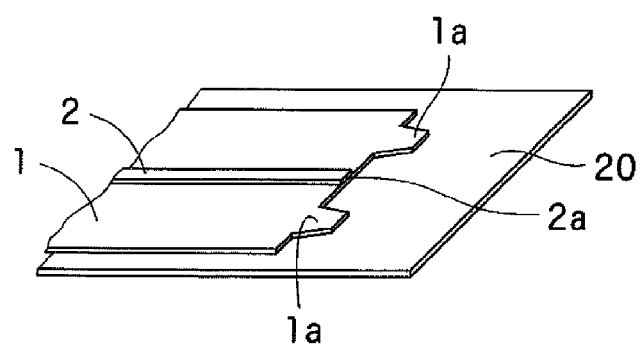
Figure 10C:
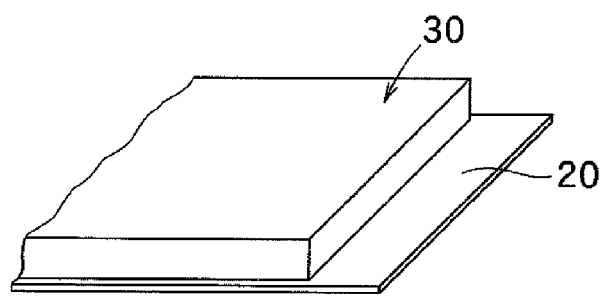
Figure 10D:
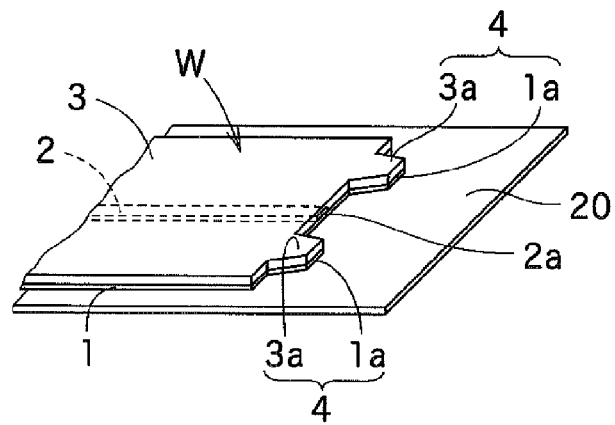

More specifically, first, as illustrated in FIG. 10A, a mold 30 is prepared which has in a lower surface thereof a recess having a mold surface 31 corresponding to the shape of the overcladding layer 3 including the protruding pieces 3a. Then, as illustrated in FIG. 10B, the undercladding layer 1 having the protruding pieces 1a is formed on the surface of the base 20. Under a state in which the core 2 is formed in the predetermined pattern on the surface of the undercladding layer 1 (similar to the state illustrated in FIG. 4B), the lower surface of the mold 30 is brought into intimate contact with the surface of the base 20 as illustrated in FIG. 10C. Here, portions 31a of the mold surface of the mold 30 corresponding to the protruding pieces 3a are located over the protruding pieces 1a of the undercladding layer 1, respectively. Then, a resin for forming the overcladding layer is injected into a mold space surrounded by the surface of the undercladding layer 1 including the protruding pieces 1a, the mold surface 31 of the mold 30, and the surface of the core 2, through an injection hole (not shown) formed in the mold 30. Thus, the mold space is filled with the resin. Then, in a case where the resin is a photosensitive resin, exposure is carried out by applying a radiation ray such as an ultraviolet ray via the mold 30, and then heating treatment is carried out. In a case where the resin is a thermosetting resin, heating treatment is carried out. This cures the resin for forming the overcladding layer to form the overcladding layer 3 including the protruding pieces 3a. After that, the mold is stripped off, and, as illustrated in FIG. 10D, a structure similar to that illustrated in FIG. 4C is obtained. The formation may be carried out in this way.

FIGS. 11A to 11D schematically illustrate manufacturing steps for the optical waveguide unit W in another form. Specifically, in the above-mentioned respective embodiments, the protruding portions 4 for locating the electric circuit unit in the optical waveguide unit W are provided by extending the stacked portions of the undercladding layer 1 and the overcladding layer 3 (see FIG. 4C), but the protruding portions 4 may be provided by extending only the overcladding layer 3. Manufacturing steps (manufacturing method) for the optical waveguide unit W are as follows.

Figure 11A:
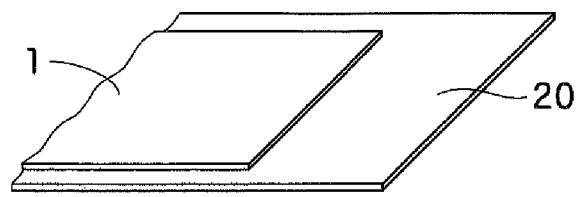
FIGS. 11A to 11D are explanatory views schematically illustrating manufacturing steps for the optical waveguide unit in another form.
Figure 11B:
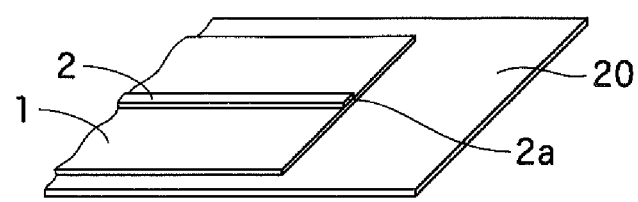
Figure 11C:
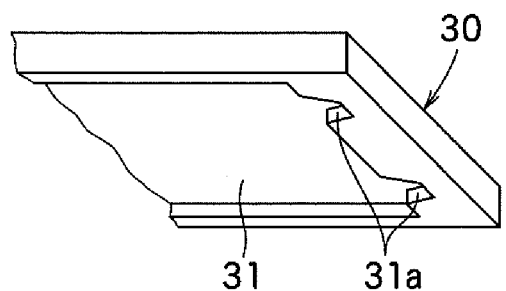
Figure 11D:
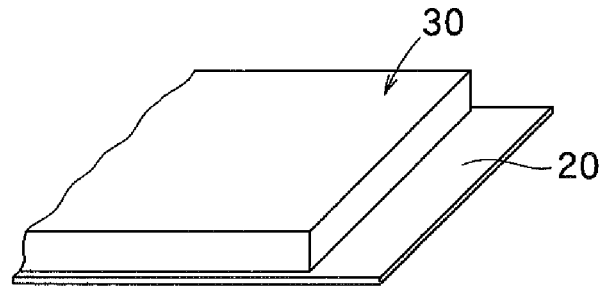
Figure 12:
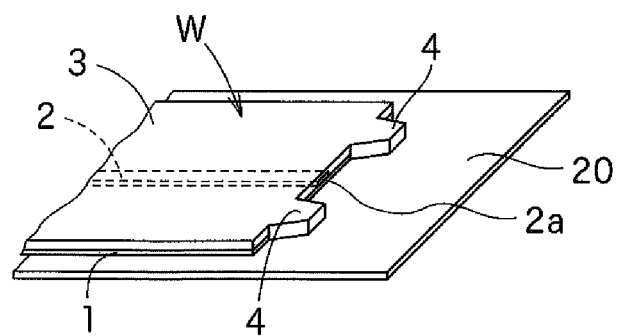
FIG. 12 is a perspective view schematically illustrating the optical waveguide unit in another form.

More specifically, first, as illustrated in FIG. 11A, the undercladding layer 1 without the protruding pieces 1a (see FIG. 4A) is formed in a predetermined region on the surface of the base 20 by photolithography. Then, as illustrated in FIG. 11B, the core 2 in the predetermined pattern is formed by photolithography on the surface of the undercladding layer 1. Next, as illustrated in FIG. 11C, a mold 30 is prepared which has in a lower surface thereof a recess having a mold surface 31 corresponding to the shape of the overcladding layer 3 including the protruding portions 4. Then, as illustrated in FIG. 11D, the lower surface of the mold 30 is brought into intimate contact with the surface of the base 20. Here, portions 31a of the mold surface of the mold 30 corresponding to the protruding portions 4 are located with respect to the light transmitting surface 2a of the core 2. Then, a resin for forming the overcladding layer is injected into a mold space surrounded by the mold surface 31 of the mold 30, the surface of the base 20, the surface of the undercladding layer 1, and the surface of the core 2, through an injection hole (not shown) formed in the mold 30. Thus, the mold space is filled with the resin. After that, similarly to the method described above with reference to FIG. 10C, the overcladding layer 3 including the protruding portions 4 is formed. After that, the mold is stripped off, and, as illustrated in FIG. 12, the optical waveguide unit W in which the protruding portions 4 are provided by extending only the overcladding layer 3 is obtained on the surface of the base 20. Alternatively, the overcladding layer 3 may be formed by, instead of the above-mentioned molding (see FIGS. 11C and 11D), photolithography.

Note that, in the above embodiment (see FIGS. 11A to 11D), the protruding portions 4 for locating the electric circuit unit are provided by extending only the overcladding layer 3, but the protruding portions 4 for locating the electric circuit unit may be provided by extending only the undercladding layer 1. Manufacturing steps (manufacturing method) for such an optical waveguide unit W are as follows. The undercladding layer 1 having the protruding pieces 1a is formed on the surface of the base 20. Under a state in which the core 2 is formed in the predetermined pattern on the surface of the undercladding layer 1 (similar to the state illustrated in FIG. 4B), the overcladding layer 3 without the protruding pieces 3a (see FIG. 4C) is formed by molding or by photolithography, and thus the optical waveguide unit W may be manufactured.

Figure 13A:
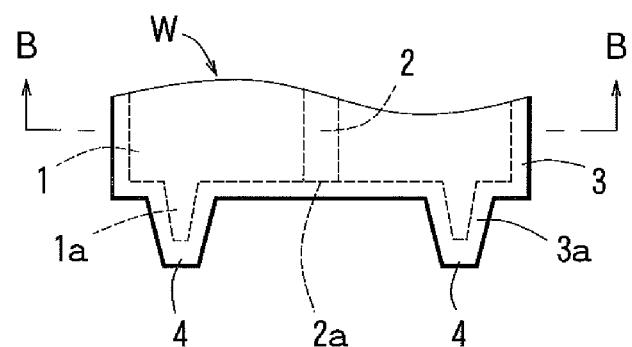
Figure 13B:
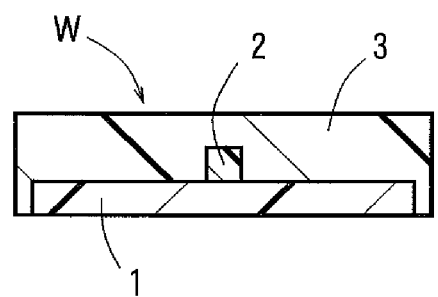

FIGS. 13A and 13B schematically illustrate the optical waveguide unit W in still another form. In this embodiment, as illustrated in FIG. 13A as a front view and FIG. 13B as a sectional view taken along the line B-B of FIG. 13A, the overcladding layer 3 is formed so as to be slightly larger than the undercladding layer 1. Such an optical waveguide unit W may also be manufactured by molding or by photolithography described above.

When the protruding portions 4 for locating the electric circuit unit is formed by molding (see FIGS. 10A to 10C, FIGS. 11A to 11D, and FIGS. 13A and 13B), the thickness of the protruding portions 4 may be formed to be thick, and thus, in a state in which the protruding portions 4 fit into the fitting holes 15 of the electric circuit unit E, the strength of the fitting portions may be enhanced. Further, in the case of the above-mentioned molding, by changing the shape of the portions 31a of the mold surface of the mold 30 corresponding to the protruding portions 4, the protruding portions 4 may be formed so that the thickness thereof gradually decreases in a direction of the extension.

Figure 14:
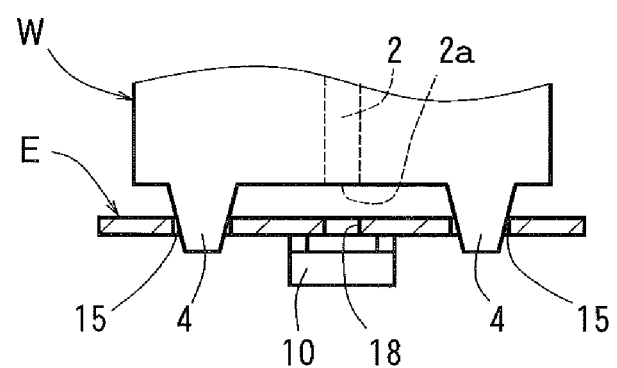
FIG. 14 is a sectional view schematically illustrating a fifth embodiment of the opto-electric hybrid board.

Note that, in the above-mentioned respective embodiments, an element of the wire bonding type is used as the optical element 10, but an element of a flip chip type may also be used. When such an element of a flip chip type is used, the light-emitting portion or the light-receiving portion is formed on a surface on which the optical element 10 is mounted (rear surface), and thus, as illustrated in FIG. 14, the optical waveguide unit W is fitted into the electric circuit unit E from the side on which the optical element 10 is not mounted, and a through hole 18 for passing light therethrough is formed at a portion of the electric circuit unit E which corresponds to the light-emitting portion or the light-receiving portion.

Further, in the above-mentioned respective embodiments, description is made with regard to one end of the opto-electric hybrid board, but the other end may have a structure which is similar to that of the one end of the above-mentioned respective embodiments. In this case, as the optical element 10, by, for example, mounting a light-emitting element on the one end side and mounting a light-receiving element on the other end side, light from the light-emitting element may be received by the light-receiving element via the core 2.

Further, in the above-mentioned respective embodiments, in the step of manufacturing the electric circuit unit E, the plating layer 16 is formed on the surfaces of the electric circuit, the optical element location defining electrode 13, and the fitting hole locating circuit 14, but the plating layer 16 is formed as necessary, and is not required to be formed when unnecessary.

Next, examples are described. However, the present invention is not limited to the examples.

EXAMPLES

<Forming Materials for Undercladding Layer and Overcladding Layer (Including Protruding Portions)>

Component A (solid epoxy resin): epoxy resin including an aromatic ring skeleton (EPICOAT 1002 manufactured by Mitsubishi Chemical Corporation)

70 parts by weight

Component B (solid epoxy resin): epoxy resin including an alicyclic skeleton (EHPE3150 manufactured by Daicel Chemical Industries Ltd.) 30 parts by weight Component C (photoacid generator): triarylsulfonium salt, 50% solution in propylene carbonate (CPI-200K manufactured by San-Apro Ltd.)

2 parts by weight

Those Components A to C were dissolved in 55 parts by weight of ethyl lactate (produced by Musashino Chemical Laboratory, Ltd.) through agitation (temperature at 80° C. and agitation of 250 rpm for 3 hours) to prepare the undercladding layer and overcladding layer forming material (photosensitive resin composition). The viscosity of the photosensitive resin composition was measured using a digital viscometer (HBDV-I+CP manufactured by Brookfield Engineering Laboratories). The viscosity was 1,320 mPa·s.

<Forming Material for Core>

Component D: o-cresol novolak glycidyl ether (YDCN-700-10 manufactured by Nippon Steel Chemical Co., Ltd) 100 parts by weight This Component D and 1 part by weight of the above-mentioned Component C were dissolved in 60 parts by weight of ethyl lactate (produced by Musashino Chemical Laboratory, Ltd.) through agitation (temperature at 80° C. and agitation of 250 rpm for 3 hours) to prepare the core forming material (photosensitive resin composition). The viscosity of the photosensitive resin composition was measured using the digital viscometer. The viscosity was 1,900 mPa·s.

Example 1

<Manufacture of Optical Waveguide Unit>

The above-mentioned undercladding layer, core, and overcladding layer forming materials were used to manufacture the optical waveguide unit having isosceles trapezoidal protruding portions for locating the electric circuit unit similarly to the case of the first embodiment. With regard to the dimensions of the isosceles trapezoidal protruding portions, the width of the longer parallel side was 2.5 mm, the width of the shorter parallel side was 1.0 mm, the height (length of the protrusion) was 3.0 mm, and the center-to-center distance between the adjacent protruding portions was 6.5 mm.

<Manufacture of Electric Circuit Unit>

The electric circuit unit having the rectangular fitting holes into which the protruding portions for locating the electric circuit unit fit was manufactured similarly to the case of the first embodiment. With regard to the dimensions of the fitting holes, the length of the openings was 2.5 mm, the width of the openings was 0.1 mm, and the center-to-center distance between the adjacent fitting holes was 6.5 mm. Note that, as the optical element, a light-emitting element which was usable both as a wire bonding type and as a flip chip type (VCSEL: ULM850-10-CO0104U manufactured by U-L-M Photonics) was mounted.

<Manufacture of Opto-Electric Hybrid Board>

The protruding portions of the optical waveguide unit were caused to fit into the fitting holes of the electric circuit unit to integrate the optical waveguide unit and the electric circuit unit. Then, the fitting portions were fixed with an adhesive.

<Light Propagation Test>

A current was caused to flow through the light-emitting element of the opto-electric hybrid board of Example 1 and light was caused to exit from the light-emitting element. It was confirmed that light exited from the other end of the core of the opto-electric hybrid board.

Example 2

<Manufacture of Optical Waveguide Unit>

An optical waveguide unit was manufactured, which was the optical waveguide unit of Example 1 with the other end having, similarly to the one end, isosceles trapezoidal protruding portions for locating the electric circuit unit. Other portions of Example 2 were formed similarly to those of Example 1.

<Manufacture of Electric Circuit Unit>

An electric circuit unit for sending was manufactured, which was the electric circuit unit of Example 1 having a driver for the light-emitting element mounted thereon. Further, an electric circuit unit for receiving was manufactured, which was the electric circuit unit of Example 1 having, instead of the light-emitting element, a light-receiving element which was usable both as a wire bonding type and as a flip chip type (PD: PDCA04-70-GS manufactured by Albis Optoelectronics) and a TIA for the light-receiving element mounted thereon. With regard to the method of mounting the light-emitting element and the light-receiving element, wire bonding and flip chip were adopted, respectively.

<Manufacture of Opto-Electric Hybrid Board>

Similarly to the case of Example 1, the electric circuit unit for sending was fixed to one end of the optical waveguide unit and the electric circuit unit for receiving was fixed to the other end of the optical waveguide unit.

<Signal Transmission Test>

A personal computer which was additionally prepared was used to control the driver and the TIA while a high speed signal was input from the electric circuit unit for sending by a pulse pattern generator, and a signal was read from the electric circuit unit for receiving by an oscilloscope. The signal transmission characteristics of the opto-electric hybrid board of Example 2 was evaluated by eye pattern evaluation. The result was that satisfactory signal transmission could be confirmed in signal transmission of 10 Gbps.

From the result of Examples 1 and 2 above, it can be found that, in the manufacturing method described above, even without an aligning operation of the core of the optical waveguide unit and the optical element (light-emitting element or light-receiving element) of the electric circuit unit, the obtained opto-electric hybrid board may appropriately propagate light.

Note that, a result was obtained that the opto-electric hybrid boards formed as described in the second to fourth embodiments above and illustrated in FIGS. 9 to 14 could also appropriately propagate light even without an aligning operation.

The opto-electric hybrid board according to the present invention may be used in an information-communication device, a signal processing device, or the like, which transmits and processes at high speed a digital audio signal, a digital image signal, or the like.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. An opto-electric hybrid board, comprising:
    an optical waveguide unit; and
    an electric circuit unit having an optical element mounted thereon, the electric circuit unit being coupled to the optical waveguide unit,
    wherein the optical waveguide unit comprises:
        an undercladding layer;
        a core for an optical path, the core being formed on a surface of the undercladding layer;
        an overcladding layer which covers the core; and
        a first protruding portion for locating the electric circuit unit, the first protruding portion being extendingly provided at a portion of at least one of the undercladding layer and the overcladding layer;
    wherein the electric circuit unit comprises:
        an electric circuit board;
        the optical element mounted at a predetermined portion on the electric circuit board; and
        a first fitting hole into which the first protruding portion fits;
    wherein the first protruding portion of the optical waveguide unit is located and formed at a predetermined location with respect to a light transmitting surface of the core;

wherein the first fitting hole of the electric circuit unit is located and formed at a predetermined location with respect to the optical element; and wherein the optical waveguide unit and the electric circuit unit are coupled to each other in a state in which the first protruding portion of the optical waveguide unit fits into the first fitting hole of the electric circuit unit.

2. The opto-electric hybrid board according to claim 1, further comprising:

a second protruding portion, the second protruding portion being extendingly provided at a portion of the optical waveguide unit which is different from the first protruding portion; and a second fitting hole into which the second protruding portion fits, which is formed in a portion of the electric circuit unit which is different from the first fitting hole.

3. A manufacturing method for an opto-electric hybrid board in which an optical waveguide unit and an electric circuit unit having an optical element mounted thereon are coupled, the method comprising:

manufacturing the optical waveguide unit comprising:
forming an undercladding layer;
forming, on a surface of the undercladding layer, a core for an optical path; and
forming an overcladding layer so as to cover the core, at least one of the forming an undercladding layer and the forming an overcladding layer comprising extendingly providing a first protruding portion for locating the electric circuit unit at a predetermined location located with respect to a light transmitting surface of the core;

manufacturing the electric circuit unit comprising:
forming an electric circuit board; and
mounting the optical element at a predetermined portion on the electric circuit board, the forming an electric circuit board comprising forming a first fitting hole into which the first protruding portion fits at a predetermined location located with respect to an expected mounting location of the optical element; and coupling the optical waveguide unit and the electric circuit unit to manufacture the opto-electric hybrid board, the coupling comprising fitting the first protruding portion of the optical waveguide unit into the first fitting hole of the electric circuit unit.

4. The manufacturing method for an opto-electric hybrid board according to claim 3, further comprising:

extendingly providing a second protruding portion at a portion of the optical waveguide unit which is different from the first protruding portion; and forming a second fitting hole into which the second protruding portion fits in a portion of the electric circuit unit which is different from the first fitting hole.

* * * * *